(12) United States Patent
Lee et al.

(10) Patent No.: US 8,120,250 B2
(45) Date of Patent: Feb. 21, 2012

(54) LIGHT EMITTER

(75) Inventors: Meng Ee Lee, Bukit Mertajam (MY); Chin Nyap Tan, Penang (MY); Eng Chuan Ong, Bukit Mertajam (MY); Yam Khoon Boo, Georgetown (MY); Yin Fei Lee, Perak (MY); Su Lin Oon, Bayan Lepas (MY)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 277 days.

(21) Appl. No.: 12/360,246

(22) Filed: Jan. 27, 2009

(65) Prior Publication Data

US 2010/0188853 A1 Jul. 29, 2010

(51) Int. Cl.
*H05B 33/04* (2006.01)
(52) U.S. Cl. .......................... 313/512; 438/106; 257/98
(58) Field of Classification Search .................. 257/40, 257/72, 98–100, 642–643, 759; 313/498–512; 315/169.1, 169.3; 427/58, 64, 66, 532–535, 427/539; 428/690–691, 917; 438/26–29, 438/34, 82, 455; 445/24–25
See application file for complete search history.

(56) References Cited

U.S. PATENT DOCUMENTS

| | | | |
|---|---|---|---|
| 5,895,302 A | 4/1999 | Chen-Lun | |
| 6,949,771 B2 | 9/2005 | Yoganandan | |
| 7,349,163 B2 * | 3/2008 | Angelini et al. | 359/708 |
| 7,405,433 B2 | 7/2008 | Chew | |
| 2003/0219919 A1 * | 11/2003 | Wang et al. | 438/26 |
| 2004/0149998 A1 * | 8/2004 | Henson et al. | 257/98 |
| 2006/0154390 A1 * | 7/2006 | Tran et al. | 438/22 |
| 2006/0226437 A1 * | 10/2006 | Fujita et al. | 257/98 |
| 2007/0102718 A1 | 5/2007 | Takekuma | |
| 2008/0261339 A1 * | 10/2008 | Koung et al. | 438/27 |
| 2008/0296599 A1 * | 12/2008 | Mazzochette | 257/98 |

OTHER PUBLICATIONS

Packaging Challenges of High-Power LEDs for Solid State Lighting by Shatil et al.

* cited by examiner

*Primary Examiner* — Nimeshkumar Patel
*Assistant Examiner* — Donald Raleigh

(57) ABSTRACT

A light emitter is disclosed herein. An embodiment of the light emitter comprises a substrate having a substrate surface; a light emitting diode located on the substrate surface; an encapsulant located on the substrate surface and encapsulating the light emitting diode; and a reflector cup attached to the substrate, the reflector cup having a reflector cup first side and a reflector cup second side with a hole extending between the reflector cup first side and the reflector cup second side, wherein the reflector cup first side is attached to the substrate surface so that the hole in the reflector cup first side encompasses the light emitting diode.

13 Claims, 3 Drawing Sheets

LIGHT EMITTER

BACKGROUND

Some light emitting devices use light emitting diodes (LEDs) or similar devices as their light sources. These light sources are very efficient and are being used in a variety of different applications. LEDs are sensitive to heat and do not operate well in hot environments. Many applications, however, require bright light, which requires that the LEDs draw a lot of current and produce a lot of extra heat. One method of cooling LEDs is to locate them on a heat conducting surface such as a ceramic substrate.

One problem with ceramic substrates is that they are difficult to cut. Accordingly, it is difficult to cut a recess deep enough to form a reflector cup for an LED in a ceramic substrate. Thus, LEDs mounted on ceramic substrates are typically expensive or lack adequate reflector cups.

DETAILED DESCRIPTION

Figure 1:
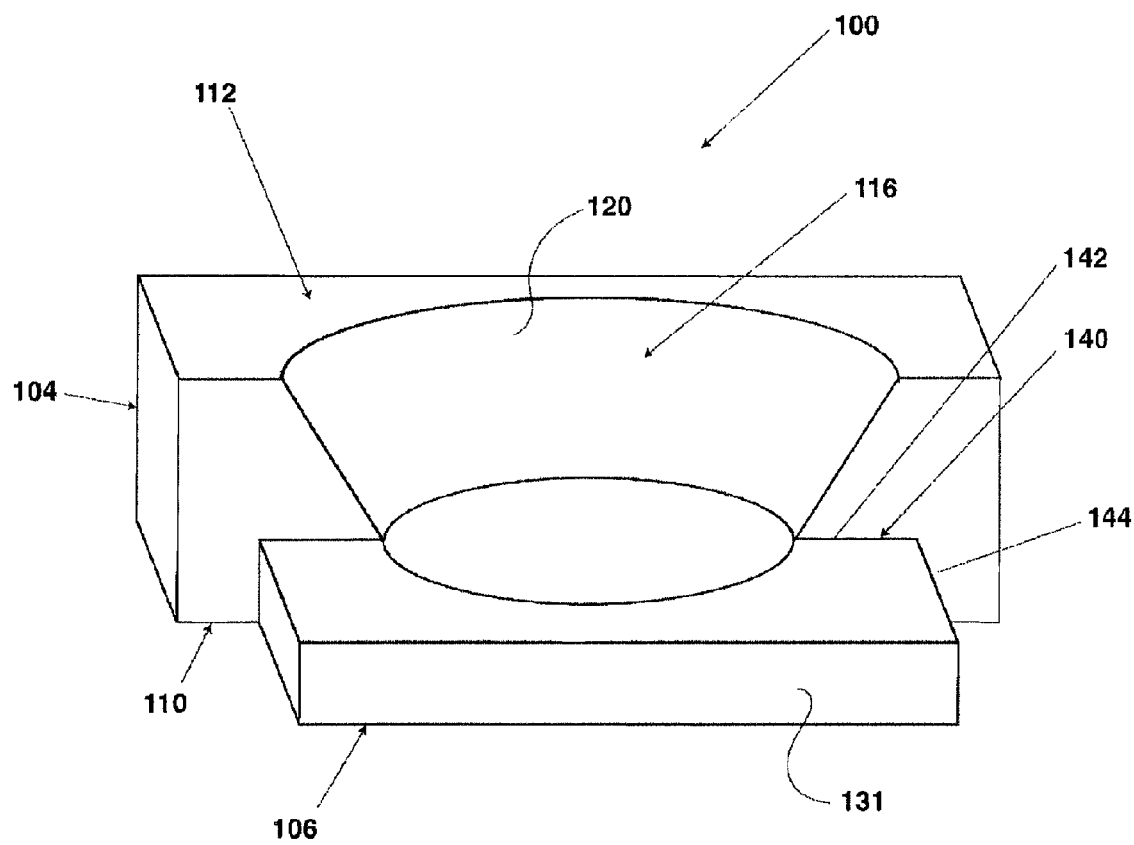
FIG. 1 is cut away top perspective view of a light emitting device.

An embodiment of a light emitter 100 is shown in FIG. 1. The light emitter 100 includes two portions, a reflector cup 104 and a substrate 106. A cut away view of the reflector cup 104 is shown in FIG. 1. As described in greater detail below, the reflector cup 104 is attached to the substrate 106. This arrangement enables the light emitter 100 to have a deep reflector cup without the necessity to form a deep recess in the substrate 106.

In some embodiments, the substrate 106 is made of a hard substance that conducts heat. One such material that may be used in the substrate 106 is ceramic. In conventional light emitters, a deep recess is formed in the substrate wherein a light emitting device, such as a light emitting diode is located in the recess. The deep recess affords a reflector cup that is able to focus light emitted by the light emitting diode. Ceramics and similar materials are rather hard, which makes it difficult to form deep recesses that are required for some lighting applications. The light emitter 100 described herein overcomes these problems by attaching the reflector cup 104 to the substrate 106. This arrangement allows for the reflector cup 104 to be deep with no or little recess needing to be formed in the substrate 106.

Figure 2:
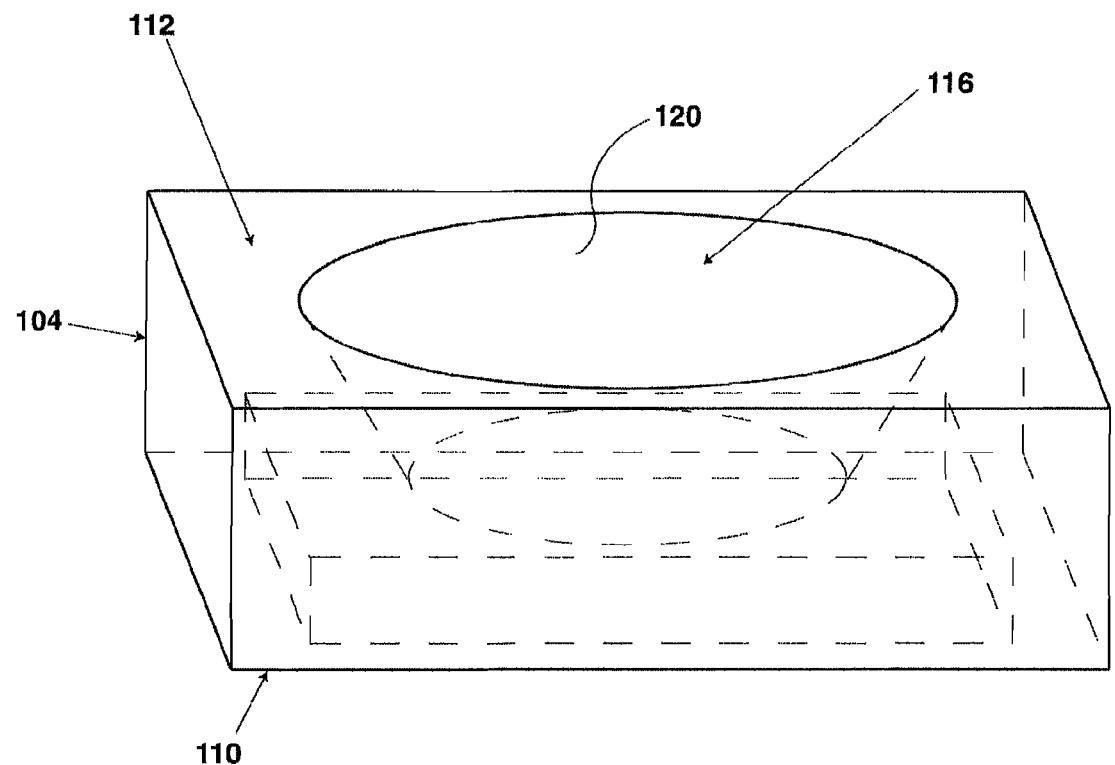
FIG. 2 is a top perspective view of the reflector cup of FIG. 1 showing the individual components.
Figure 2:
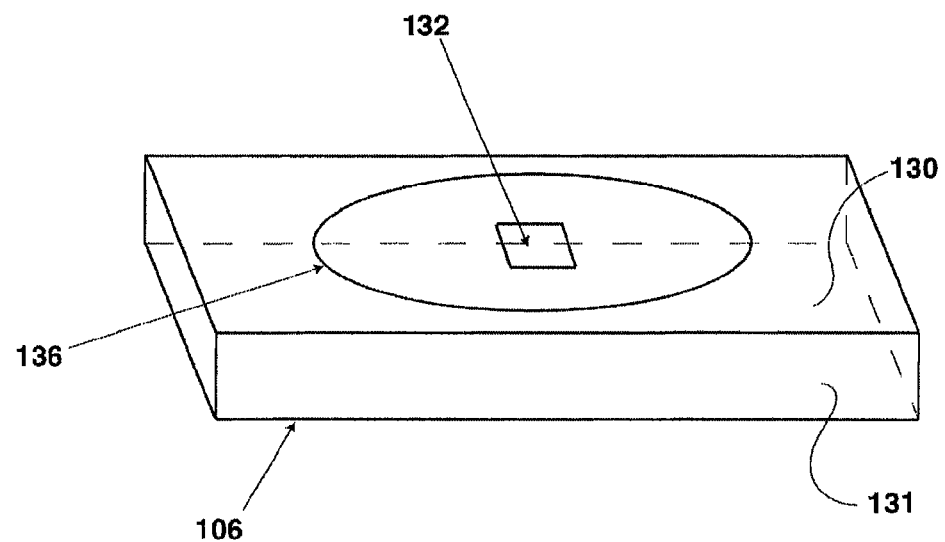

FIG. 2 shows the reflector cup 104 separate from the substrate 106. Referring to both FIG. 1 and FIG. 2, the reflector cup 104 has a first side 110 and a second side 112 wherein the first side 110 faces the substrate 106. A hole 116 extends between the first side 110 and the second side 112. The hole 116 may be conical shaped, wherein the portion of the hole 116 on the first side 110 is smaller than the portion of the hole 116 on the second side 112. The shape of the hole 116 may be fabricated in order to direct light in a predetermined beam pattern as described in greater detail below. The hole 116 has an interior surface 120 that may be reflective or more reflective than the material of the substrate 106. The reflective inner surface 120 enables a greater amount of light to be reflected from the light emitter 100.

In the embodiments described herein, the substrate 106 is made of ceramic. The ceramic substrate 106 is a rigid material that provides very good heat transfer characteristics to assure that heat generating components mounted to the substrate 106 can dissipate their heat. The substrate 106 has a top surface 130 on which a light emitting diode (LED) 132 is mounted. In some embodiments, the LED 132 is mounted within a recessed portion of the top surface 130. The substrate 106 also has a side surface 131 that may be substantially orthogonal to the top surface 130. In addition to the LED 132, the top surface 130 or internal structure of the substrate 106 has electrical connections that serve to connect the LED 132 to an external source of power. As stated above, the ceramic substrate 106 pulls or conducts heat from the LED 132 to keep it cool during operation.

The LED 132 may be encapsulated with an encapsulant, such as silicon. The encapsulant may be a conventional encapsulant used in LED-type light emitters and serves to keep contaminants from the LED 132. The encapsulant may also contain materials that react with the light emitted by the LED 132 so that the light emitter 100 emits a different wavelength of light than the light emitted by the LED 132. These materials may include, but are not limited to, different types of phosphor.

In some embodiments, the top surface 130 has a recessed portion 136 that accommodates the LED 132. The recessed portion 136 may be deep enough so that the encapsulant covers the LED 132, but does not seep onto the top surface 130. As stated above, the substrate 106 may be a relatively hard material. Therefore, cutting a deep hole in the substrate 106 to form a reflector cup is expensive. The recessed portion 136 does not have to be very deep and, thus, is not very expensive to fabricate. The hole 116 in the second side 110 of the reflector cup 104 may have the same size diameter or slightly larger diameter than the diameter of the recessed portion 136 of the top surface 130 of the substrate 105.

As shown in FIG. 1, the reflector cup 104 is attached to the substrate 106 after the substrate 106 is complete. More specifically, the second side 110 of the reflector cup 104 is attached to the surface 130 and/or the side surface 131 of the substrate 106. Many different configurations for attaching the reflector cup 104 to the substrate 106 may be used as described in greater detail below. In some embodiments, the reflector cup 104 is attached to the substrate 106 after the LED 132 is tested.

In some embodiments, the second side 110 of the reflector cup 104 has a ledge 140 that is used to secure and align the reflector cup 104 to the substrate 106. The ledge 140 has ledge first surface 142 and a ledge second surface 144 that may be substantially orthogonal to each other. The ledge first surface 142 contacts the top surface 130 of the substrate 106. The ledge second surface 144 may be shaped to receive the substrate 106 wherein the side surface 131 of the substrate 106 is proximate the ledge second surface 144. The use of the ledge 140 enables proper alignment between the LED 132 and the reflector cup 104. More specifically, the reflector cup 104 is located in a predetermined location relative to the substrate 106 by way of the ledge 140. The alignment enables the light emitter 100 to have a predetermined light pattern. Either portion of the ledge 140 may be attached to either the top surface 130 or side surface 131 of the substrate.

Figure 3:
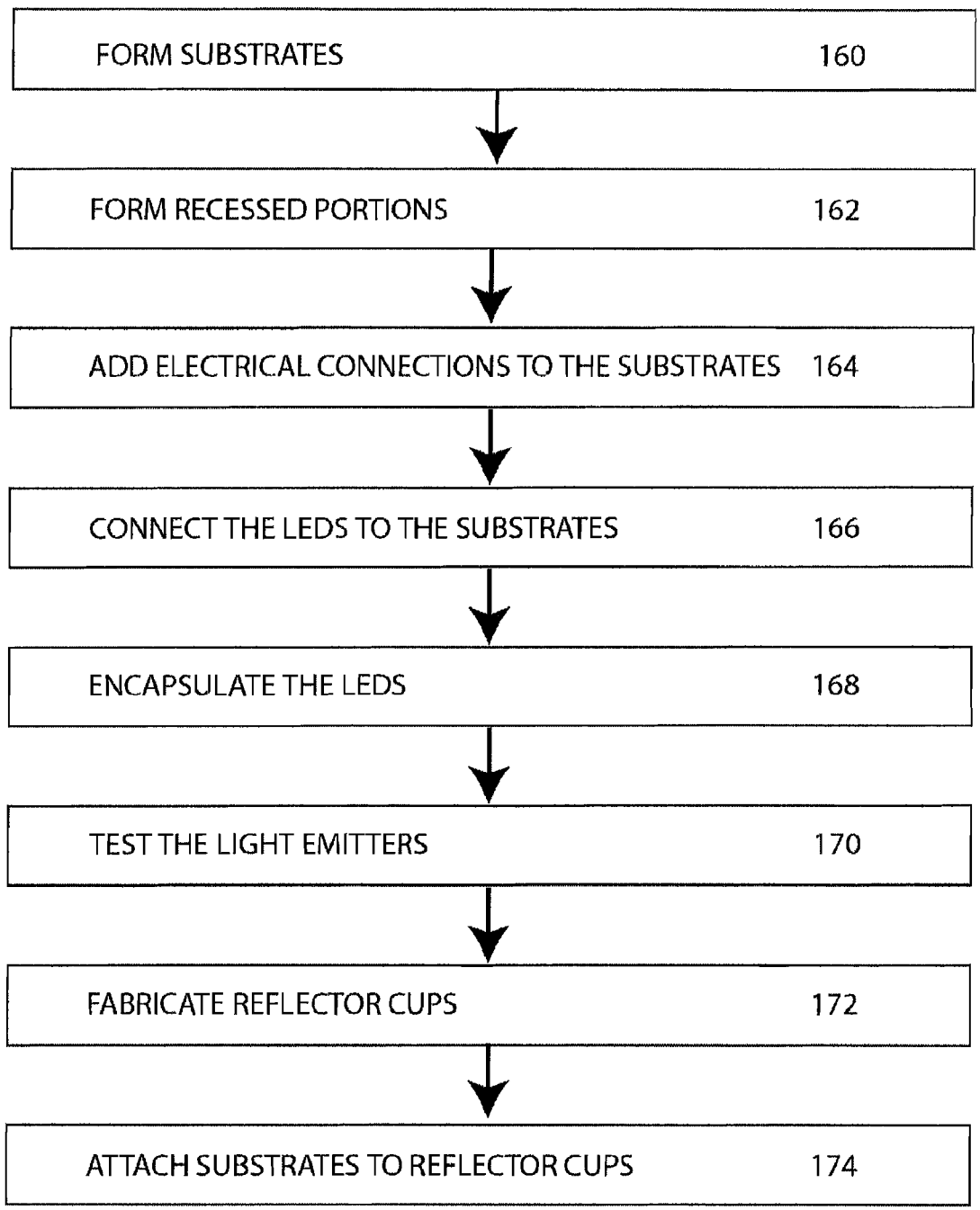
FIG. 3 is a flow chart of an embodiment for manufacturing the reflector cup of FIG. 1.

An embodiment of a method of manufacturing the light emitter 100 is shown in the flowchart of FIG. 3. Other methods will be described in addition to the method shown in FIG. 3. The process begins at step 160 by forming substrates. The light emitter 100 is described above as being a single device; however, during manufacturing, a plurality of substrates 106 may be formed from a single larger substrate that is cut or the like. In step 162, recessed portions 136 are formed in the substrates 106. The recessed portions 136 may be formed as the substrates 106 are formed or they may be cut into the substrates 106 after they are formed. At step 164, the electrical connections may be added to the substrate 106.

The LEDs 132 may be connected to the substrates 106 at step 166. At step 168, the LEDs 132 are encapsulated. At this point in the manufacturing process, the light emitters 100 may be tested per step 170. If all the light emitters 100 on the larger substrate function properly or a predetermined number of them function properly, the individual substrates 106 may be separated from the larger substrate. By testing the LEDs 132 before the reflector cups 104 are attached to the substrates 106, defective substrates 106 are not connected to reflector cups 104. This process reduces waste of the reflector cups 104.

Concurrent to the fabrication of the substrates 106, the reflector cups 104 may be fabricated per step 172. The substrates 106 may then be attached to the reflector cups 104 per step 174. As shown in FIG. 1 and as described above, the ledge 140 in the reflector cups 104 enables the reflector cups 104 to be properly aligned with the substrates 106 and the LEDs 132 mounted thereto. The alignment reduces production costs of the light emitters 100. The attachment of the reflector cups 104 to the substrates 106 also enables the holes 116 to be deep and have shapes that cause the light emitters 100 to emit predetermined light beams.

What is claimed is:

1. A light emitter comprising:
   a substrate having a substrate surface and at least one side surface;
   a light emitting diode (LED) located on the substrate surface;
   an encapsulant encapsulating the light emitting diode;
   a recess portion of the substrate surface, wherein the recess portion is configured to accommodate the light emitting diode and the encapsulant such that the encapsulant encloses the light emitting diode within the recess portion; and
   a reflector cup attached to the substrate, the reflector cup having a reflector cup first side and a reflector cup second side with a hole extending between the reflector cup first side and the reflector cup second side, wherein the reflector cup first side is attached to the substrate surface such that the substrate surface and all of the at least one side surface are enclosed by and in contact with the reflector cup.

2. The light emitter of claim 1, wherein the substrate is comprised of at least one ceramic material.

3. The light emitter of claim 1, wherein the hole in the reflector cup first side encompasses the recessed portion.

4. The light emitter of claim 1, wherein the hole is conical shaped and wherein the hole in the reflector cup first side is smaller than the hole on the reflector cup second side.

5. The light emitter of claim 1, wherein the reflector cup first side has an alignment structure having first and second surfaces formed therein, and wherein the alignment structure is configured to receive the substrate such that the substrate is encompassed within the alignment structure, with the first surface of the alignment structure approximating the substrate surface and the second surface of the alignment structure approximating the at least one side surface of the substrate.

6. The light emitter of claim 5, wherein when the substrate is received within alignment structure, the LED is located in a predetermined position relative to the reflector cup.

7. The light emitter of claim 1, wherein the reflector cup is mounted in a predetermined position relative to the LED.

8. A method of manufacturing a light emitter, the method comprising:
   providing a substrate having a substrate surface, at least one side surface and electrical connections, wherein the substrate comprises a recess portion;
   connecting a light emitting diode to the electrical connections;
   encapsulating the light emitting diode with an encapsulant such that the encapsulant is within the recess portion;
   testing the light emitting diode; and
   connecting a reflector cup to the substrate surface if the result of the testing indicates that the light emitting diode is functional, the reflector cup having a reflector cup first side and a reflector cup second side with a hole extending between the reflector cup first side and the reflector cup second side, wherein the reflector cup first side is attached to the substrate surface such that the substrate surface and all of the at least one side surface are enclosed by and in contact with the reflector cup.

9. The method of claim 8, wherein the connecting a light emitting diode to the electrical connections comprises locating the light emitting diode within the recessed portion.

10. The method of claim 8, wherein the testing comprises applying electricity to the electrical connections.

11. The method of claim 8, wherein the reflector cup first side has alignment structure having first and second surfaces formed therein, the alignment structure configured to receive the substrate within the alignment structure such that the first surface approximating the substrate surface and the second surface approximating the at least one side surface of the substrate, and wherein the connecting a reflector cup to the substrate surface comprises locating the substrate within the alignment structure.

12. The method of claim 11, wherein the locating causes the substrate to be in a predetermined fixed position relative to the reflector cup.

13. The method of claim 8, wherein the reflector cup is one of a plurality of reflector cups fabricated together.

* * * * *